United States Patent [19]

Ueda

[11] 4,399,352
[45] Aug. 16, 1983

[54] HEATING DEVICE WITH SEPARATE DISPLAY MEANS FOR THE TYPES OF DATA ENTERED

[75] Inventor: Shigeki Ueda, Nara, Japan

[73] Assignee: Matsushita Electric Industrial Co., Ltd., Osaka, Japan

[21] Appl. No.: 185,913

[22] PCT Filed: May 10, 1979

[86] PCT No.: PCT/JP79/00117

§ 371 Date: Jan. 3, 1980

§ 102(e) Date: Jan. 3, 1980

[87] PCT Pub. No.: WO79/01058

PCT Pub. Date: Dec. 13, 1979

[30] Foreign Application Priority Data

May 12, 1978 [JP] Japan .................................. 53-56912

[51] Int. Cl.³ .............................................. H05B 1/02
[52] U.S. Cl. ............................... 219/506; 219/10.55 B; 219/492; 340/722; 340/716
[58] Field of Search ............... 219/490, 491, 493, 492, 219/494, 506, 10.55 B, 10.55 F; 73/352; 99/DIG. 14; 426/233; 340/584, 711, 717, 722, 753, 347 M, 716

[56] References Cited

U.S. PATENT DOCUMENTS

| | | | |
|---|---|---|---|
| 3,819,906 | 6/1974 | Gould, Jr. | 219/506 |
| 4,046,991 | 9/1977 | Seftar et al. | 219/501 |
| 4,206,336 | 6/1980 | Cunningham | 219/506 |
| 4,206,872 | 6/1980 | Levine | 219/492 |
| 4,230,731 | 10/1980 | Tyler | 219/10.55 B |
| 4,234,784 | 11/1980 | Totterdell | 219/10.55 B |
| 4,250,370 | 2/1981 | Sasaki et al. | 219/10.55 B |
| 4,255,639 | 3/1981 | Kawabata et al. | 219/10.55 B |

FOREIGN PATENT DOCUMENTS

| | | | |
|---|---|---|---|
| 50-63480 | 6/1975 | Japan | 219/10.55 B |
| 52-17235 | 2/1977 | Japan | 219/10.55 B |
| 52-134149 | 11/1977 | Japan | 219/10.55 B |
| 53-77359 | 8/1978 | Japan | 219/10.55 B |

*Primary Examiner*—M. H. Paschall
*Attorney, Agent, or Firm*—Spencer & Kaye

[57] ABSTRACT

Input setting keys and displays for a heating device such as an electric oven or an electronic range having a digital control section. A key for setting the heating time is provided. By operating this key, the heating time is digitally indicated. A key for setting the heating temperature is also provided. By operating this key, the heating temperature is indicated by lighting a plurality of indication units, thus simplifying the input operation while at the same time improving the viewability of the indication.

3 Claims, 10 Drawing Figures

4,399,352

HEATING DEVICE WITH SEPARATE DISPLAY MEANS FOR THE TYPES OF DATA ENTERED

TECHNICAL FIELD

This invention relates to means for setting and indicating the input of a heating device such as an electric oven or electronic range having a digital control section.

BACKGROUND ART

Prior art heating devices such as electric ovens or electronic ranges generally have an operating section as shown in FIG. 1. In other words, the device is comprised of an operating panel 3 including a time switch 1 of the rotary type for setting the heating time and a temperature-setting knob 2 having a control section such as an oil thermostat or bimetal. Numeral 4 designates a body, and 5 a door. As can be seen, most of the prior art operating sections comprise analog input means including a setting section of the rotary or slide type. This is attributable to the user's sense of familiarity with analog quantities, the setting facility, the low cost of control parts, etc.

On the other hand, recent development in electronics has been remarkable. Especially, the advent of the microcomputer and large scale integrated circuits is expected to make possible complicated controls at low cost. For this reason, the necessity has suddenly arisen for providing the control section as a digital system. FIG. 2 shows an example of the electronic range with a temperature sensor having such a digital control system. The operating panel 3 is provided with ten numeral keys 6 for inputting heating time and temperature and a time key 8 and a temperature key 9 for declaring which of the time and temperature setting operations are to be set on the control section and shown on the indication section 7. In addition, various functional keys including a start key for commanding a heating start are provided as required. Now, in this configuration, the temperature and time setting operations are effected by the following procedures. First, the temperature key 9 is depressed, followed by operating the numeral key 6 for setting the heating temperature. At this time, this set temperature is indicated as, say, "210C" on the indication section 7. Next, the time key 8 is depressed, followed by the depression of the numeral key 6 whereby the heating time is set. At this time, the indication section 7 switches from the temperature indication to the time indication, so that the heating time such as "1000" (10 minutes) is indicated.

The example shown in FIG. 2 has three inconvenient points from the viewpoint of operability. The first point is that such an indication is not clear from the fact that one indication section is used for dual purposes by switching. In other words, it is impossible to know the time and temperature at the same time. This disadvantage may be obviated by providing two indication sections. However, it requires another indication section of four digits each having seven segments, so that a total of 28 segments must be handled, thereby leading to a bulky control section. Secondly, temperature setting is complicated in that it is required to search for predetermined numeral keys three times after the depression of the temperature key. This is troublesome and lacks a good sense of operability as compared with the device shown in FIG. 1 in which setting is completed by a single turn of the temperature setting knob 2. Thirdly, if the present temperature is indicated at the beginning of heating, the set temperature is unknown, while if the set temperature is indicated at the beginning of heating, the present temperature is not known, thus making it impossible to comprehend the heating process. This shortcoming is common to the example shown in FIG. 1. Namely, in the case of a timer, the remaining time is known by the decrement of the set time. In the case of temperature which increases gradually, however, there has not yet been found any convenient method by which both the set value and the present value are known by such a simple indication.

DISCLOSURE OF INVENTION

Accordingly, an object of this invention is to provide a heating device with a digital control system to thereby improve the operability and to enable a clear indication, which system includes a temperature key and a heating key as the input operating section, and an operation indication section which in turn includes a heating time indication section for digital indication and a heating temperature indication section having a plurality of indication units which are lit in different numbers with the change in temperature.

An embodiment of the present invention will be described below with reference to the drawings.

BEST MODE FOR CARRYING OUT THE INVENTION

Figure 3:
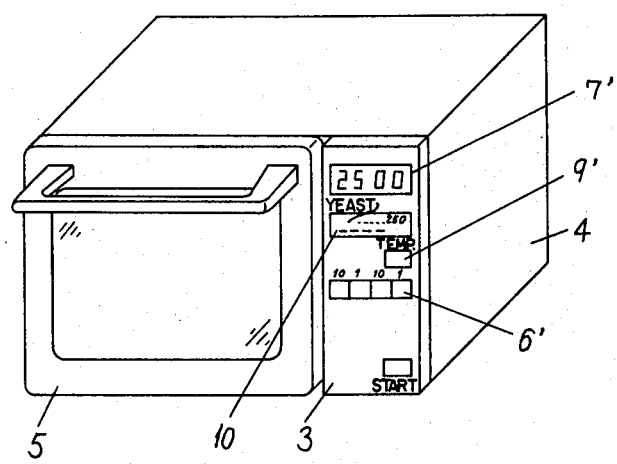
FIG. 3 is a perspective view showing the body of the heating device according to an embodiment of the present invention.

FIG. 3 is a perspective view showing the body of the device according to an embodiment of the present invention. The operating panel 3 has a time indication section 7' used exclusively for indication of heating time, a temperature indication section 10 used exclusively for indicating the heating temperature, a numeral key 6' for inputting the heating time, and a temperature key 9' for inputting the heating temperature. In addition, a start key for commanding a heating start or a clear key for cancelling the data input is provided as required.

Figure 4:
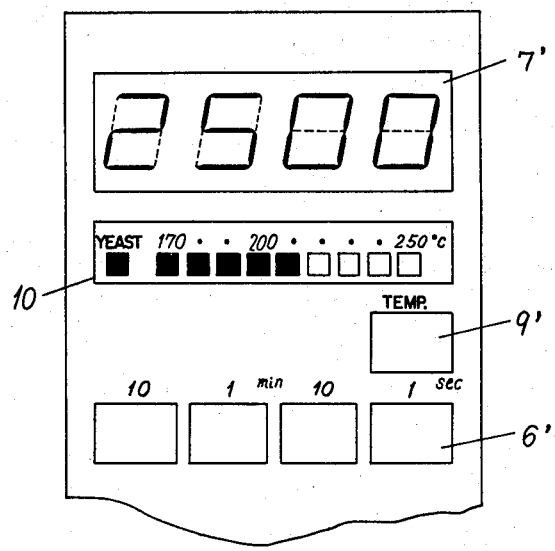
FIG. 4 is a detailed diagram showing the essential part of the heating device of FIG. 3.

FIG. 4 is a diagram showing this operating panel in detail. The temperature indication section 10 comprises ten segments, the lowest order of which indicates a yeast fermentation temperature, followed by temperature indications at ten points from 170° C. to 250° C. at intervals of 10° C. In this configuration, by depressing the temperature key 9' once, the yeast segment of the lowest order is lit. Further depressing of the temperature key 9' transfers the indication to the adjacent segment each time the key is depressed, thus setting at the control section a temperature which may be stepped at intervals of 10° C. corresponding to the indication. In other words, by operating the temperature key 9' six times, the temperature is set at 210° C. On the other hand, the heating time is set by the use of four numeral keys 6'. Each of the keys corresponds to each of the four digits of the time indication section 7'. Each time they are depressed, the content is updated. If the time is to be set at 25 minutes, for instance, the 10 min key is depressed twice and the 1 min key is depressed five times.

In this way, the temperature and time are completely separated from each other for both the input section and the indication section. Thus the operation is greatly facilitated such that in spite of the digital control, the heating conditions can be set as easily as in the case of the analog input means shown in FIG. 1. Further, only 10 segments need be added for this purpose. This number may be appropriately increased or decreased as required. Nevertheless, as compared with the indication section having seven segments of four digits resulting in an increase of 28 segments, the arrangement of the control section is greatly simplified. Thus, the first and second disadvantages mentioned with reference to the prior art have been obviated.

Figure 5A:
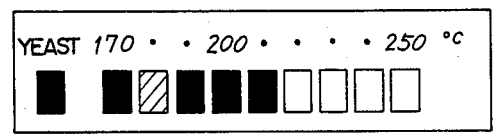
FIG. 5 is a diagram illustrating a method for obtaining temperature indication.

Next, methods for obtaining the simultaneous indication of present temperature and set temperature after heating start will be explained, which indication caused the third disadvantage. FIG. 5a illustrates an example in which the present temperature flickers and the set temperature is lit continuously, thus indicating both temperatures at the same time. In the Figure, it is seen that the set temperature is 210° C. and the present temperature is 180° C. The present temperature may alternatively be indicated with the same effect by continuous extinction. As another alternative, not only the segment corresponding to the present temperature is made to flicker but also the lower segments, i.e., both the 170 and the yeast segments in the Figure may be made to flicker or to be extinguished.

Figure 5B:
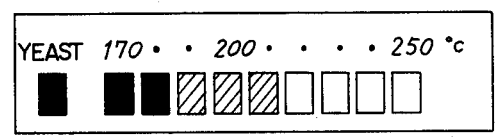

On the contrary, FIG. 5b shows the case in which the present temperature is indicated by continuous lighting and the set temperature flickers, whereby both temperatures can be known at the same time. In this case, too, the 180 segment alone may be alternatively continuously lit and the 210 segment is made to flicker.

Further, the present temperature and the set temperature may be indicated repeatedly alternately. In other words, the device is so constructed that the temperature of 180° C. is indicated at a certain timing and 210° C. at the next timing. In this case, too, it is possible to know both temperatures substantially at the same time.

As seen from above, in spite of the fact that the temperature indication section deals with a digital amount, it has a considerable analog character, thus simply obviating the difficult problem of simultaneous indication of the present temperature and the set temperature. By the way, if the detected value of temperature is indicated directly for indication of the present temperature, the quantization of the indication temperature causes a phenomenon in which the indication fluctuates between two segments in the boundary of adjacent blocks. If the temperature indication is effected in the form of the average of values detected during about, say, 30 seconds, this problem is obviated.

Figure 6A:
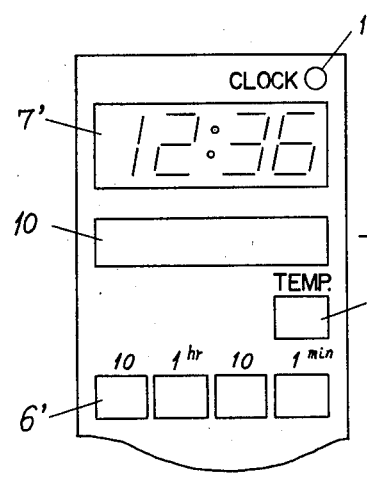
FIG. 6 is a detailed diagram showing the essential part of another embodiment of the present invention.
Figure 6B:
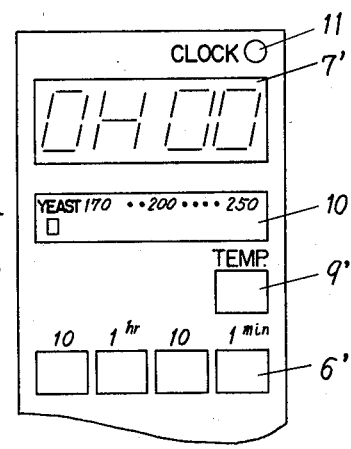

FIG. 6 shows an example in which a clock indication function is added to the present invention. The time or hour can be input by operating the clock key 11 and the numeral key 6'. And the clock indication is given as shown in FIG. 6a when the device is not used as an electric oven or an electronic range. If the temperature indication section 10 is left non-indicative that is, in a non-actuated mode in which it is blank, the clock is easily visible, thus saving the electricity cost. In an electronic circuit, the power consumption at the indication section including a light-emitting diode or a fluorescent display lamp is high, which can not be ignored. Now, in order to switch from such a clock indication to an electric oven or the like, the temperature key 9' is depressed. Thus, the clock indication is cleared as shown in FIG. 6b, so that the time indication section 7' is switched to the timer indication. In this example, the timer comprises an hour-minute meter with the indication of "0H00". Further, an initial display mode is actuated wherein a temperature scale on the temperature indication section 10', and the yeast at the lowest digit is lit. In this way, by keeping the temperature indication section 10 non-indicative (blank) normally, the mode change-over is made clear, thus improving the operability. As an alternative construction, the first operation of the temperature key presents the temperature scale alone, while the yeast segment is lit at the second operation. Also, if the device is so constructed as to enable a "preheating" operation, i.e., if heating is started without setting a time, it is easily operated. In this case, an anouncement is made when the set temperature is reached, and the reached temperature is maintained.

Figure 1:
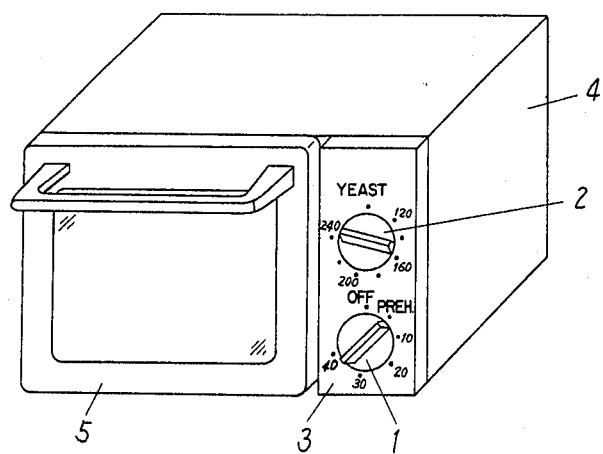
FIG. 1 is a perspective view showing the body of a prior art heating device.
Figure 2:
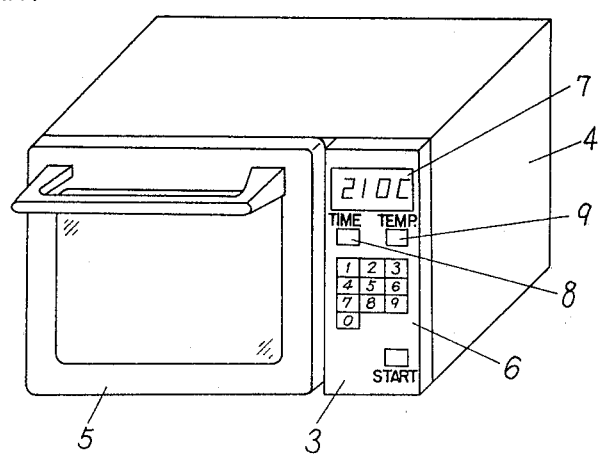
FIG. 2 is a perspective view showing the body of another prior art heating device.

In the embodiments explained above, the numeral keys 6' may be ten in number as in the prior art, which is a dispensable component element of the invention. Also, instead of incrementing the heating temperature from a low to a higher value by tapping the temperature key 9', the setting may be decremented from the highest temperature or a specific starting temperature. Further, after the setting reaches a maximum or minimum value, the starting condition may be restored for repetition of a similar endless indication, or the temperature may be decremented from the maximum temperature after increment. Furthermore, instead of counting the number of key depressions for tapping, the time length of depression may alternatively be used for predetermined setting. For instance, the device may be so configured that the continued depression of the temperature key causes the indication to be incremented every one second. According to another conceivable method, the input keys may be so constructed that the input data set in analog form by the rotary knob as shown in FIG. 1 is converted into a digital value by an AD converter and indicated as well as transmitted to the control system. In this case, the analog input setting section and the AD converter may be collectively considered to be "digital input means". In the example of FIG. 6, if the first timer indication is made of a value which is very frequently indicated, the number of operations is further reduced. Namely, it is such an arrangement that "0H00" for 30 minutes is indicated instead of "0H00". The set temperature may be the temperature inside of the storage portion of the heating chamber, the temperature at the exhaust port, or the internal temperature of the object to be heated which is measured by insertion of a probe containing a sensor such as a thermistor directly into the object to be heated.

Figure 7:
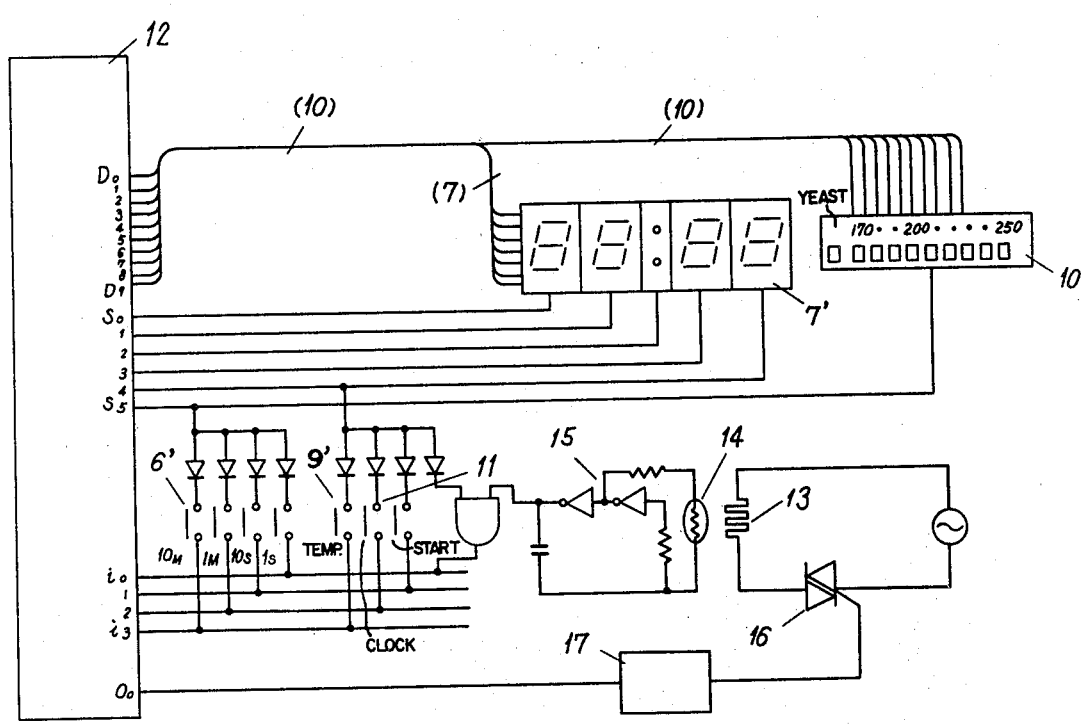
FIG. 7 is a circuit diagram showing an example of the circuit configuration.

Next, the arrangement of the control section making possible the operating system and indication as explained above will be explained. FIG. 7 shows an example employing a microcomputer. The terminals $i_0$ to $i_3$ of the microcomputer 12 are input terminals for receiving information from the numeral keys 6', the temperature key 9' and the clock key 11. Further, a temperature sensor 14 such as a thermistor for directly or indirectly sensing the temperature of the heater 13 or other heat source is incorporated as part of the oscillator 15, thereby to receive the temperature information modulated into frequency information. The indication is effected by the use of data buses $D_0$ to $D_9$ and the digit scan ports $S_0$ to $S_5$. At the data buses, the segment data (7 bits) of each digit of the time indication section 7' and the temperature segment data (10 bits) of the temperature indication section 10 are dynamically produced in accordance with the digit scan port signal. The timing of dynamic lighting is such that one period is divided into six parts. Of these timings, key inputs are fetched in parallel at the timings $S_4$ and $S_5$. The control port $O_0$ controls the power supply to the heater 13 via a switching element 16. Numeral 17 shows a drive for the switching element 16.

By this arrangement, various input information is processed in the microcomputer 12, and produced in the form of required indication data and control signal. And the various operating systems and methods of indication mentioned above are made possible.

Figure 8:
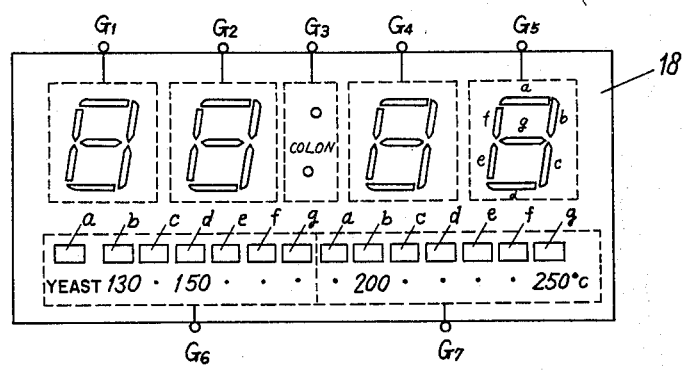
FIG. 8 is a front view showing the indication section according to still another embodiment of the present invention.

FIG. 8 shows an example in which the two indication sections 7' and 10 are unified and which comprises a fluorescent indication tube. This time temperature indication section 18 comprises seven grids $G_1$ to $G_7$ and eight segments a to g and a colon. The seven segments of the numeral section in each grid and the seven segments of the temperature section corresponding thereto are electrically connected with each other.

Figure 9:
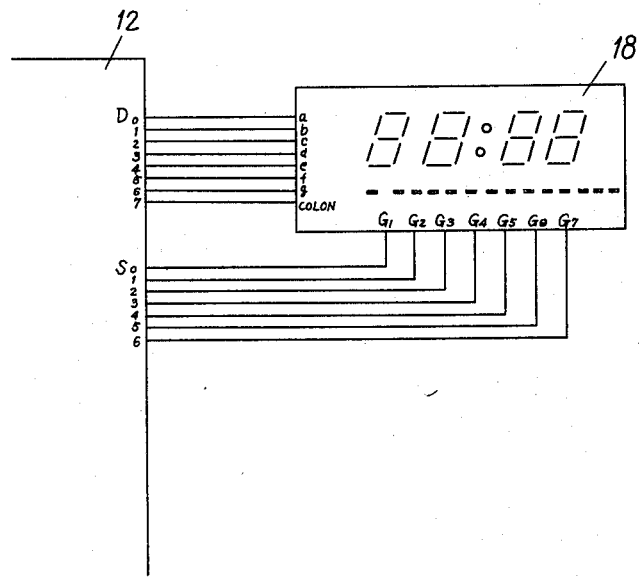
FIG. 9 is a circuit diagram showing the indication section of FIG. 8.

FIG. 9 shows the connection of the indication section 18 and the microcomputer 12. The seven grids are swept by the seven digit scan ports $S_0$–$S_6$, and the indication data are carried to the eight segments by the eight signal lines comprising the data buses $D_0$ to $D_7$. Each of the data buses is weighted for producing the indication data after conversion into a predetermined hexadecimal data of two digits of PLA or the like in the microcomputer. Each segment corresponds to each data bus as shown in the following table.

TABLE

| $D_7$ | $D_6$ | $D_5$ | $D_4$ | $D_3$ | $D_2$ | $D_1$ | $D_0$ |
|---|---|---|---|---|---|---|---|
| 8 | 4 | 2 | 1 | 8 | 4 | 2 | 1 |
| COLON | g | f | e | d | c | b | a |

Figure 10:
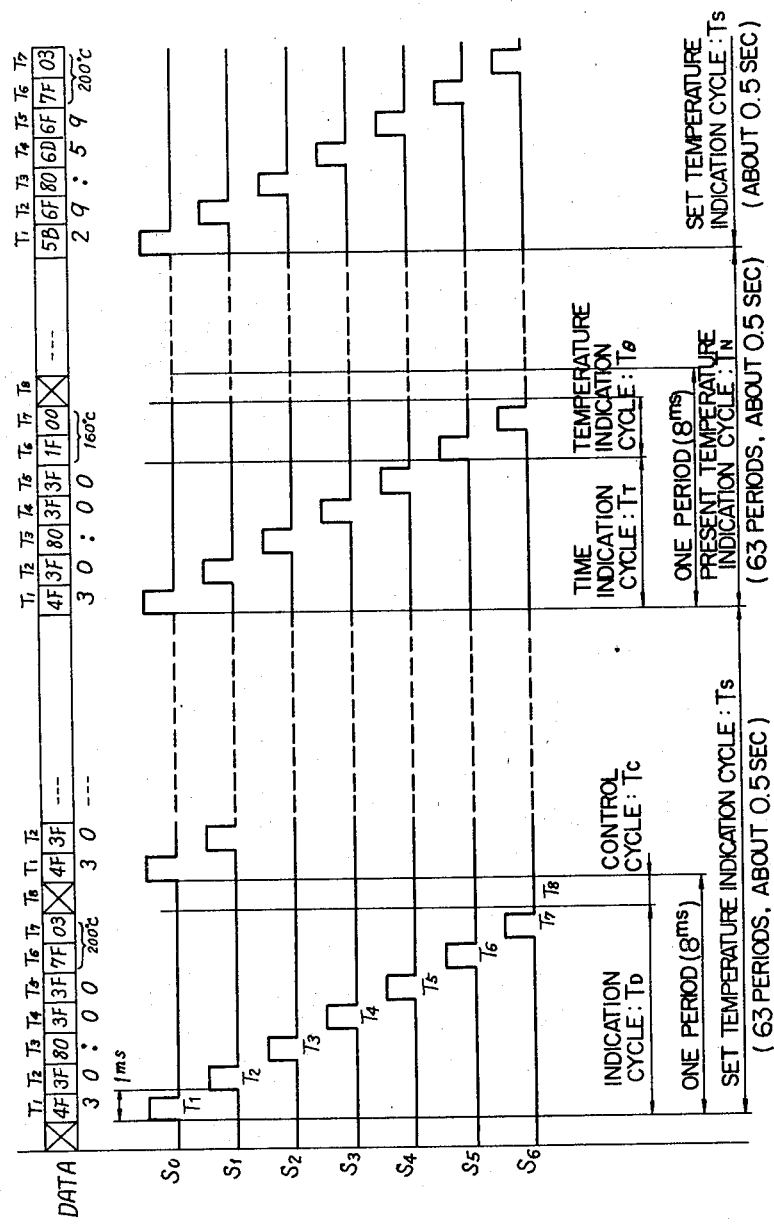
FIG. 10 is a timing chart for the circuit of FIG. 9.

FIG. 10 is a timing chart for the indication section constructed as mentiond above. One period is divided into eight sections $T_1$ to $T_8$ at intervals of 1 ms, so that the first seven sections $T_1$ to $T_7$ are used for indication and the remaining section $T_8$ is used for controlling each part. The indication cycle $T_D$ is further subdivided into two parts including the time indication cycle $T_T$ of $T_1$ to $T_5$ for time indication and the temperature indication cycle $T_\theta$ of $T_6$ to $T_7$ for temperature indication.

As an example, in the case where "30 minutes" is set and the temperature of "200° C." is selected, the hexadecimal data "4F" corresponding to the first time digit "3" is produced at $T_1$, followed by sequential production of the hexadecimal data "3F", "80", "3F" and "3F" corresponding to "0", ":", "0" and "0" respectively in synchronism with the timings $T_2$ to $T_5$. In this way, "30:00", i.e., "30 minutes" is indicated on the time indication section. Next, "7F" is produced at the data bus at $T_6$. Accordingly, all the lower digits for temperature indication from "yeast" to "180° C." which are controlled by the grid $G_6$ are lit. Further, "03" is produced at $T_7$, so that the segments a and b of digit $G_7$, i.e., "190° C." and "200° C." are lit. Thus, "200" and lower segments in the temperature indication are lit.

The foregoing shows a specific example of the method of indication. According to this embodiment, the indication section is dynamically lit at the duty cycle of $\frac{1}{8}$.

Next, an example of the method for indicating the present temperature will be described. Assume that the set temperature is "200° C." and the present temperature is "160° C.". First, the set temperature is indicated for about 0.5 second during 63 periods as mentioned above. Next in a similar manner, the output signal of the present temperature detected by the sensor is produced during 63 periods. In quite the same manner as in the case of indication of the set temperature, the lower digits of the indication section are lit at $T_6$ and the higher digits of the indication section are lit at $T_7$. In the case of "160° C.", "1F", i.e., segments a to e are lit at $T_6$, and "00", i.e., all segments are extinguished at $T_7$. Thus, the "160" and lower segments are lit on the temperature indication section. After this present temperature indication cycle $T_S$, the indication returns to the set temperature indication cycle $T_S$ again, so that alternate indications of the set temperature and the present temperature are repeated at intervals of 0.5 second. As a result, as shown in FIG. 5b, the indication is realized such that the present temperature appears to be lit continuously while the set temperature flickers. In the case a, the segment corresponding to the present temperature alone is extinguished in the present temperature indication cycle $T_N$.

INDUSTRIAL APPLICABILITY

As explained above, according to the present invention, a heating device such as an electric oven or an electronic range having a digital control section has the advantage that a digital temperature input can be handled in the same manner as an analog input, input setting is easy, and indication of the present temperature is facilitated and easy to understand, thus simplifying the arrangement of the control section.

I claim:

1. A heating device, comprising:
   a heating chamber for receiving an object to be heated;
   at least one heat source for heating said object;
   a main controller for controlling said heat source to heat said object;
   time input means for setting a heating time for said object into said main controller;
   time display means comprising a first plurality of indicator segments for indicating the heating time controlled by said controller;
   temperature input means for setting a heating temperature into said main controller, said temperature input means having a single temperature key and count means for counting one of (a) the number of times said temperature key is repetitively depressed and (b) the period of time during which said temperature key is maintained in its depressed state, said main controller setting the heating temperature in correspondence with one of the number of times said temperature key is repetitively depressed and the period of time during which said temperature key is maintained in its depressed state;

temperature display means comprising a second plurality of indicator segments for indicating the heating temperature controlled by said main controller; and clock setting means for setting the hour of the day on said time display means, said time display means normally displaying the hour of the day and said temperature display means being maintained in a non-actuated mode; said time display means being switched from displaying the hour of the day to displaying the heating time and said temperature display means being switched from said non-actuated mode to an initial display mode upon operation of said single temperature key, further operation of said single temperature key displaying the desired heating temperature on said temperature display means.

2. A heating device according to claim 1 which further comprises temperature detecting means coupled to said main controller for detecting the temperature within said heating chamber, said temperature input means, temperature detecting means and main controller cooperating to display simultaneously on said temperature display means the temperature set into said controller by said temperature input means and the temperature detected by said temperature detecting means, one of said temperature indications being on continuously and the other being on intermittently.

3. A heating device according to claim 1 which further comprises temperature detecting means coupled to said main controller for detecting the temperature within said heating chamber, said temperature input means, temperature detecting means and main controller cooperating to display on said temperature display means the temperature set into said controller by said temperature input means and the temperature detected by said temperature detecting means, said temperatures being displayed alternately on said temperature display means.

* * * * *